United States Patent
Winter et al.

(10) Patent No.: US 7,543,999 B2
(45) Date of Patent: Jun. 9, 2009

(54) OPTICAL MODULE HERMETICALLY PACKAGED IN MICRO-MACHINED STRUCTURES

(75) Inventors: Marcus Winter, Potsdam (DE); Ralf Hauffe, Berlin (DE); Arnd Kilian, Berlin (DE)

(73) Assignee: Hymite A/S, Lyngby (DK)

( * ) Notice: Subject to any disclaimer, the term of this patent is extended or adjusted under 35 U.S.C. 154(b) by 51 days.

(21) Appl. No.: 11/225,758

(22) Filed: Sep. 12, 2005

(65) Prior Publication Data

US 2006/0072883 A1     Apr. 6, 2006

Related U.S. Application Data

(60) Provisional application No. 60/609,284, filed on Sep. 13, 2004.

(51) Int. Cl.
G02B 6/36 (2006.01)
G02B 6/32 (2006.01)

(52) U.S. Cl. .............................. 385/93; 385/31; 385/33; 385/39; 385/49; 385/88; 385/90; 385/92; 385/94

(58) Field of Classification Search .................... 385/93
See application file for complete search history.

(56) References Cited

U.S. PATENT DOCUMENTS

| | | | | |
|---|---|---|---|---|
| 4,897,711 | A * | 1/1990 | Blonder et al. ................. | 257/48 |
| 4,997,254 | A * | 3/1991 | Ganev .......................... | 385/90 |
| 5,347,605 | A * | 9/1994 | Isaksson ....................... | 385/92 |
| 5,600,741 | A | 2/1997 | Hauer et al. | |
| 5,867,622 | A * | 2/1999 | Miyasaka et al. .............. | 385/88 |
| 6,307,197 | B1 * | 10/2001 | Krug et al. ............. | 250/227.24 |
| 6,477,303 | B1 * | 11/2002 | Witherspoon ................. | 385/52 |
| 2002/0071639 | A1 * | 6/2002 | Kropp .......................... | 385/88 |
| 2004/0033031 | A1 | 2/2004 | Zaborsky et al. | |
| 2004/0101020 | A1 * | 5/2004 | Bhandarkar .................. | 372/109 |
| 2004/0151442 | A1 * | 8/2004 | Scruggs et al. ................ | 385/92 |
| 2006/0078262 | A1 * | 4/2006 | Chen ........................... | 385/93 |

FOREIGN PATENT DOCUMENTS

| | | |
|---|---|---|
| DE | 4140434 A1 | 6/1993 |
| EP | 0331331 A | 9/1989 |
| EP | 0689071 A | 12/1995 |
| GB | 2397393 A | 7/2004 |

OTHER PUBLICATIONS

Osenbach et al., "Low Cost/High Volume Laser Modules Using Silicon Optical Bench Technology," In Proceedings from the 48th Electronic Components and Technology Conference, (Institute of Electrical and Electronics Engineers, New York, 1998) 581-587.

(Continued)

Primary Examiner—Frank G Font
Assistant Examiner—Ryan Lepisto
(74) Attorney, Agent, or Firm—Fish & Richardson P.C.

(57) ABSTRACT

An optical module comprising an opto-electronic component, a lens and a mirror that is hermetically sealed by a micro housing containing a lid and a base is disclosed. The optical module may be assembled onto a moveable holder for aligning an optical beam into an optical assembly having an optical waveguide.

29 Claims, 10 Drawing Sheets

OTHER PUBLICATIONS

Winter et al., "Simplified Optical Coupling and Alignment Scheme for Cost Effective 10 Gbit/s TOSA Modules Based on Edge Emitters Hermetically Packaged in Micro-Machined Silicon Structures," Proc. Of Optical Fiber Communication Conference and Exposition (Optical Society of America, Washington, DC) Mar. 2005 OThU8.

Jordache et al., "A High Coupling Efficiency Optical Design Compatible with Direct Modulated and Electroabsorptive Lasers," in Proceedings from Electronic Components and Technology Conference, (Institute of Electrical and Electronics Engineers, New York, 2005) pp. 239-245.

* cited by examiner

US 7,543,999 B2

OPTICAL MODULE HERMETICALLY PACKAGED IN MICRO-MACHINED STRUCTURES

CROSS-REFERENCE TO RELATED APPLICATIONS

This application claims priority from U.S. Provisional Patent Application No. 60/609,284, filed Sep. 13, 2004. The disclosure of the provisional application is incorporated herein by reference.

FIELD OF THE INVENTION

The invention relates to an optical module with an integrated opto-electronic component and optical assemblies incorporating such a module. The optical module may contain a lens for collimating or focusing an emitted optical beam and a mirror for aligning the emitted optical beam to another optical module. The optical module may include one or more optical, optoelectronic and electronic components.

The invention also relates to a method for coupling an optical beam into an optical assembly containing an optical waveguide.

BACKGROUND OF THE INVENTION

Packaging of opto-electronic components, as opposed to semiconductor or electronics integrated circuits, requires not only hermeticity for preventing moisture from entering the package, but also precise alignment of optical components for achieving maximum light-coupling efficiency. The conventional TO (Transistor-Outline) technology poses a daunting challenge for the opto-electronic designers because it limits the possibility to provide both accurate alignment and hermeticity.

SUMMARY OF THE INVENTION

According to one aspect, an optical module includes an opto-electronic component, a lens and a mirror, all of which are hermetically integrated into a micro housing. The micro housing comprises a lid and a base for encapsulating the optical components. The lid is transparent to wavelengths of the light emitted by the opto-electronic component, and the base can be made from silicon or other suitable materials.

In one implementation, the lens is mounted on the base for directing the emitted light into the mirror. In another implementation, the lens may be integrated with the lid or formed as the interior of the base. The lens may include, but is not limited to, a ball lens, a plano-convex lens, a cylindrical gradient lens, a graded index (GRIN) lens and other diffractive optical elements (DOEs).

According to another aspect, a micro housing having an optical module including an opto-electronic component, a lens and a mirror mounted on the optical module is mounted on a spherical holder having a cut-out region for the micro housing to facilitate proper alignment. Adhesive or other attaching means may be used for securing the micro housing to the holder. The center point of the spherical holder and the point around which the micro housing is to be rotated to compensate for optical misalignment within the optical module which occurs due to positioning tolerances may coincide (within a margin of error).

In another aspect, a method is disclosed to provide an optical module in which an opto-electronic component is optionally coupled to an optical assembly containing an optical waveguide. The method includes positioning a lens in front of an opto-electronic component in a manner that a transversal offset between the opto-electronic component and the lens leads to a tilt of the optical beam exiting the lens about a fixed point on the optical axis of the lens. The method may include refocusing the beam into an optical waveguide using an optical assembly that is rotated about the fixed point.

In some implementations, one or more of the following features may be present. A collimating or focusing ball lens or other suitable optical element having a predetermined refractive index may be utilized. The properties of the lens may be such that the lens can be placed near the opto-electronic component while converting the emitted light into a nearly collimated or focused beam.

A mirror may have a slanted surface to redirect the optical beam to a predetermined direction and may be coated with a reflecting material, such as silicon, glass, dielectric layer stack(s), or metal layers, to act as a reflecting surface for redirecting the emitted light at the exit of the lens into another optical module or optical waveguide. The tilted surface may be formed by using standard etching, molding or polishing techniques.

In another implementation, holes having a 45° sidewall may be etched into the base by cutting the wafers forming the base at an angle of, for example, 9.74° to the (100) crystallographic plane for serving as a mirror. Similarly, mirrors with other plane angles may be obtained.

Yet in another implementation, a glass wafer may be molded to have holes with at least one metallized sidewall tilted at a predetermined angle and operable as a mirror.

In a related aspect, a holder holding a micro housing containing an optical module may be mechanically inserted into an assembly containing an optical fiber. The assembly includes a housing and a connector-receptacle for an optical fiber which is positioned within the housing by a ferrule sleeve, among other optical components.

Some implementations may include one or more of the following features. An optical isolator, a wavelength filter serving as a wavelength locker, a narrow wavelength filter mounted at a tilted angle towards the optical beam or a partial mirror for reflecting the optical beam back into the opto-electronic component, may be inserted into the beam path exiting the opto-electronic component. A second lens optionally may be included in the beam path to refine the collimation of the optical beam.

In various implementations, one or more of the following advantages may be present. Due to the passive alignment of collimating optics and the positioning tolerance associated with the optical module, the collimated beam exiting the optical module may be tilted with respect to the receptacle axis. To reduce the complexity, time consumption and cost associated with active fiber alignment technique, the holder is assembled onto the housing so as to compensate for any beam misalignment incurred during transmission by adjusting the holder.

The details of one or more embodiments of the invention are set forth in the accompanying drawings and the description below. Other features and advantages of the invention will be apparent from the description and drawings, and from the claims.

DESCRIPTION OF DRAWINGS

Like reference symbols in the various drawings indicate like elements.

DETAILED DESCRIPTION

Figure 1A:
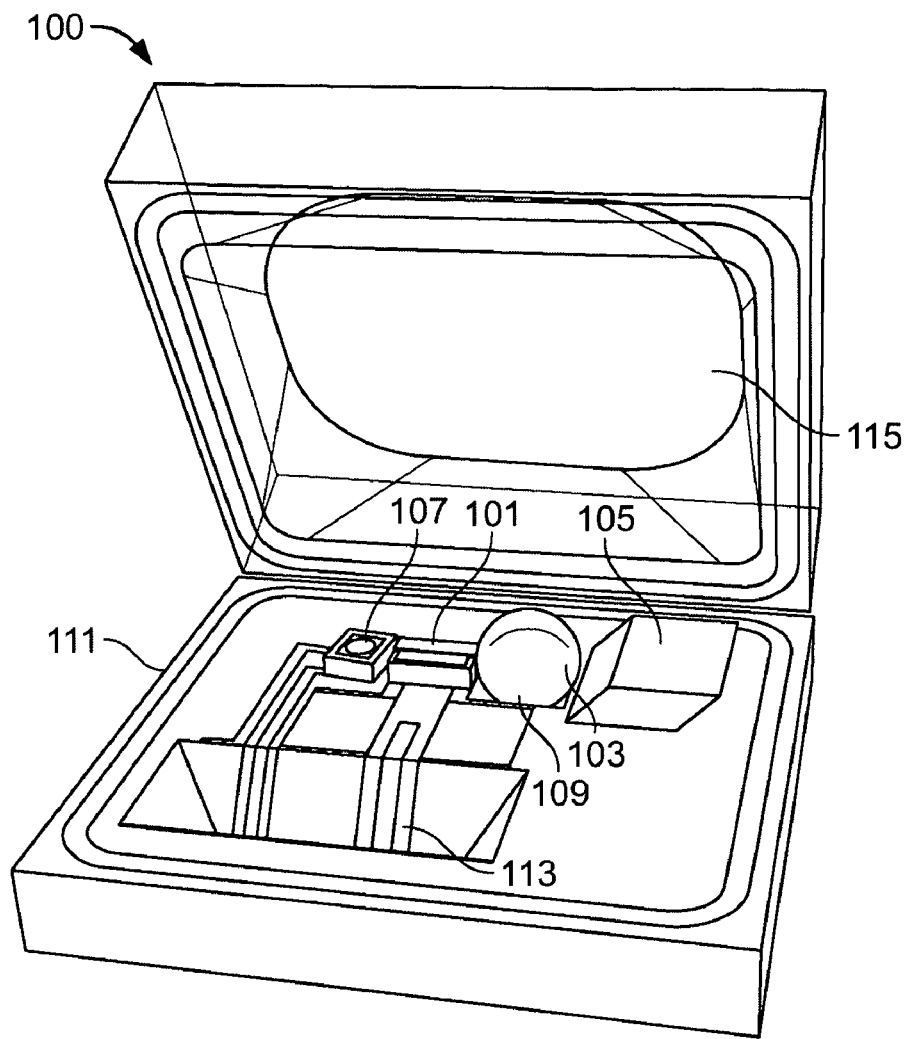
FIG. 1A illustrates assembly of an optical module encapsulated by a micro housing according to a first implementation.

In the following description, various implementations of the invention are described. However, it will be apparent to those skilled in the art that the implementations may be practiced with only some or all aspects of the present invention. For purposes of explanation, specific numbers, materials and configurations are set forth in order to provide a thorough understanding of the implementations. However, it will also be apparent to one skilled in the art that the implementations may be practiced without the specific details. In other instances, well known features are omitted or simplified in order not to facilitate understanding of the invention.

The following will describe a simplified alignment and optical coupling technique which allows for cost-effective transmitter optical subassembly (TOSA) modules based on opto-electronic components to be implemented hermetically. As will be explained, passive alignment of the collimating optics is combined with both hermetic packaging and active alignment of the receptacle to improve light coupling efficiency between the output of the opto-electronic component and the optical waveguide.

The performance of an opto-electronic component depends on how well its output beam can be coupled into an optical waveguide. This coupling efficiency is usually very intolerant to slight changes in the alignment geometry.

Generally, the coupling of the output of the opto-electronic component into the optical waveguide can be simplified into the coupling of the output of the opto-electronic component into the transformation of the fundamental waveguide mode. This can be done via the lens inside the receptacle onto a plane perpendicular to the optical axis between both lenses, at which point both beams are substantially collimated and have a large waist, for example 100 microns. This also applies to a single-lens implementation; that is, to achieve low-loss, alignment-tolerant coupling, the output of the opto-electronic component should be mode-matched to the transformed fundamental mode of the optical waveguide. Due to the manufacturing-related geometry tolerance of the optical components placed in the optical beam path, the matchable modes are tilted with respect to each other, resulting in poor coupling efficiency. This is shown in FIGS. 1C-1D, in which coupling efficiencies between two Gaussian modes having, respectively, a beam waist of 4.6 microns (e.g., corresponding to a single-mode optical fiber) and 50 microns (e.g., representative of a collimated beam) are illustrated. As shown, the degree of the relative mode offset is inversely proportional to coupling efficiency. In other words, as the degree at which the matchable modes are tilted increases, the coupling efficiency between a single-mode optical fiber and a collimated beam deteriorates. The graphs are based on analytical solutions of the mode overlap integral, which is a mathematical function describing the coherent coupling between arbitrary (complex) fields, using two-dimensional Gaussian field distributions with tilts or offsets.

In contrast, the spherical receptacle alignment technique disclosed in the present invention permits one to sacrifice optimum spatial field overlap for minimal angular misalignment by adjusting the position of the fiber-lens assembly along the curved surface of the interface between the fiber and the lens.

Reference is now made to FIG. 1A, which depicts an optical module 100 comprising an opto-electronic component 101, a lens 103 disposed at the output of the opto-electronic component 101, a 45° mirror 105 positioned at the exit of the lens 103, a power monitor 107 which monitors the power of the emitted light, and vias 113 for electrically connecting various optical components mounted on the base 111. In the implementation of FIG. 1A, the opto-electronic component 101, the lens 103 and the 45° mirror 105 are hermetically integrated into a micro housing having a lid 115 and the base 111 for encapsulating the optical components. The micro housing can be made from materials such as, but not limited to, silicon or other suitable materials. A shaped groove 109 optionally can be etched into the micro housing using, for example, standard wet or dry etching methods, to provide mechanical support for passive alignment of the lens 103 collimating or focusing the emitted light. In passive alignment, an approach to using V-groove or other suitable shaped grooves as a guide for connecting the optical module into another optical assembly also may be adopted. Any suitable metal structures meeting design, manufacturing, and performance criteria also can be employed instead of the shaped groove 109 for securing the position of the lens 103. Alternatively, the lens 103 may be positioned using a pattern recognition system without the need for a shaped groove or other mechanical support.

Figure 1B:
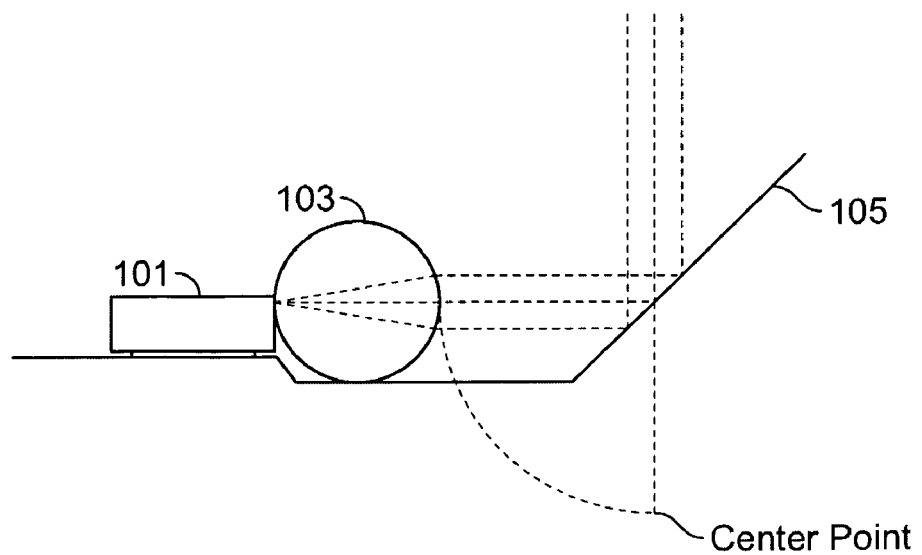
FIG. 1B illustrates a general setup of the optical components inside the optical module of FIG. 1A.
Figure 1C:
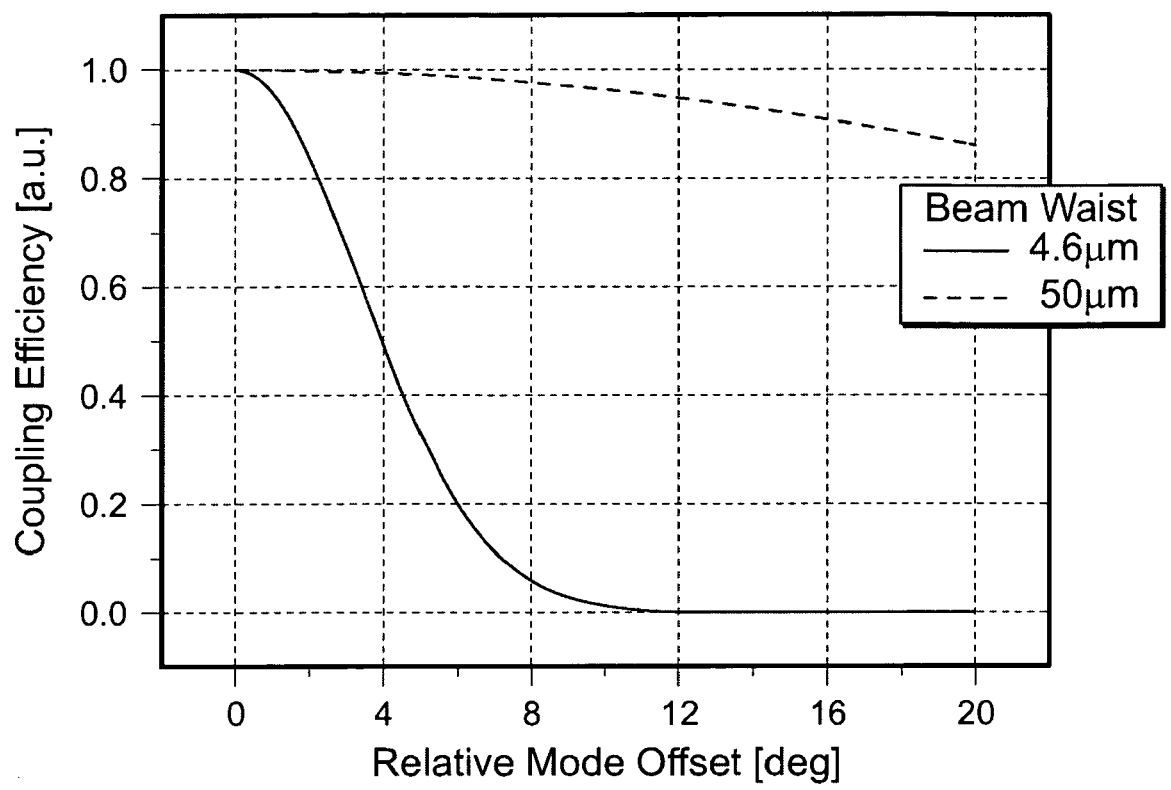
FIGS. 1C-1D are graphs showing coupling efficiency between two Gaussian modes.
Figure 1D:
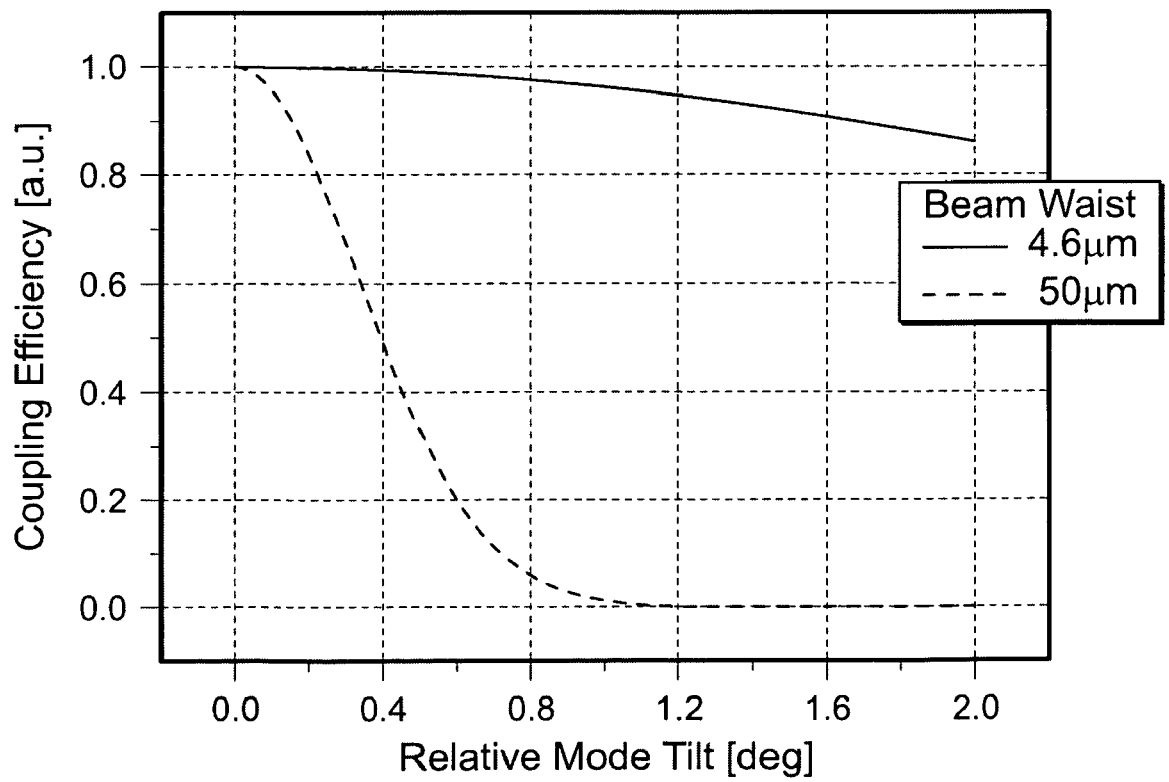

FIG. 1B illustrates a general setup of the optical components inside the optical module of FIG. 1A. As shown in FIG. 1B, the lens 103 is passively aligned in front of the opto-electronic component 101, which may include a light receiving element, for example, a photodiode, and/or a light emitting element, for example, an edge emitting laser. In one aspect, the optical module comprises a first silicon die with etched grooves for accommodating coplanar micro-vias and a V-groove into which a ball lens having a predetermined refractive index is bonded using adhesive. The redirection of the collimated beam through the lens 103 and the lid 115 may be provided by a 45° plane of a second micro-machined silicon die, which is cut at an angle of about 9.74°, bonded onto the first die. It may be advantageous to solder opto-electronic component 101 onto the base 111 in a manner that its front facet produces a collimated or focused beam whose width is primarily determined by the diameter of the lens 103.

Although a ball lens is employed in the demonstration above, a plano-convex lens, possibly made from silicon, a cylindrical graded index (GRIN) lens, or a diffractive optical element also may be used so long the properties of the lens allow the lens to be placed near the opto-electronic component so as to convert the emitted light into a substantially collimated beam.

In this implementation, the ball lens 103 can be made from glass or other transparent substrates, and may be coated with suitable materials to minimize reflections. In general, light incident upon the curved boundaries of the ball lens changes direction, and the focal length of the transmitted light is dependent upon the refractive index of the lens. One advantage of using a ball lens in this implementation is that the ball lens can perfectly be placed around the center axis of the emitted light while minimizing any possible phase-front distortion of the collimated light associated with aberration. Another advantage of using such a lens is that a misplacement of the lens with respect to this center axis of the emitted light can be compensated for as a result of the tilt of the collimated light with respect to this center axis. Accordingly, as the collimated beam, having a width, for example, in the range of 100 microns, exits the optical module into a connector-receptacle of an optical fiber, the ball lens, which also may be a regular fused silica or BK7 lens, allows the collimated beam to be refocused subsequently into the optical fiber at the optimum coupling efficiency. Methods for employing a plano convex lens are disclosed in "A Highly Coupling Efficiency Optical Design Compatible With Direct Modulated and Electroabsorptive Lasers" authored by Nicholas Jordache et al. (2005 Electronic Components and Technology Conference), the disclosure of which is incorporated herein by reference in its entirety.

According to this implementation, the mirror 105 is provided on the silicon base 111 as a separate component having a slanted surface tilted at an angle of about 45°. Although a 45° mirror is illustrated, any optical component coated with a reflecting material, such as silicon, glass, dielectric layer stack(s) or other metal layers, to act as a reflecting surface for redirecting the emitted light exiting the ball lens 103 into another optical module or optical waveguide at an angle of usually 90° (i.e., usually perpendicular to the lens) also may be used. The titled surface or the mirror 105 as a whole can be formed by using standard etching, molding or polishing methods.

Alternatively, in place of the 45° mirror 105, holes having a 45° sidewall can be etched into the base 111. Using an etchant such as potassium hydroxide (KOH), one side of the sidewalls of the holes can be formed to have an angle of 45° towards the surface thereof. The slanted sidewall can be metallized to serve as a mirror so as to facilitate the redirection of the optical beam through the lid 115. Another possibility is to mold a glass wafer to have holes with at least one metallized sidewall titled at an angle of 45°.

Inside and outside the micro housing, die pads that function as a base for mounting electro-optical components or onto which wire bonds are patterned can be fabricated using standard deposition and photolithography methods. Electrical lines for routing external electrical signals into the micro housing also can be constructed. If these electrical signals are radio-frequency (RF) signals, the electrical lines can be laid out to form RF-signal waveguides, for example, in the shape of co-planar lines. In one aspect, each section of the die pads may have various electrical resistance by forming each section using a different metal or alloy so that the connection of the RF-signal waveguide to the opto-electronic component can be matched in resistance to the impedance of the waveguide. Additional discrete electronic components, such as coil or capacitors, can be attached to the silicon base even over the resistor section of the electrical lines. Alternatively, coils can also be formed by proper layout of the electrical lines of the package. This allows for the integration of such functionalities as bias circuits. Further details regarding these coils are disclosed in related U.S. Patent Publication No. 2005/0093667, (U.S. patent application Ser. No. 10/699,981, filed Nov. 3, 2003), the disclosure of which is incorporated herein by reference in its entirety.

The electrical lines can be routed into the micro housing through the hermetic vias. This can be achieved by etching fine holes, which are hermetically sealed using a feed-through metallization process. Various techniques may be used to form the hermetically sealed through-hole connections. One such technique uses a multilayer structure that includes a substantially etch-resistant layer sandwiched between a first semiconductor layer and a second semiconductor layer. The first and second semiconductor layers may include a material selected, for example, from a group comprising silicon nitride, silicon oxy-nitride or silicon dioxide. The through-holes may be formed using a double-sided etching process in which the first and second semiconductor layers are continuously etched until the etch-resistant layer is exposed to define the locations of the through-holes. The through-holes then may be formed by removing part of the etch-resistant layer. The through-holes may be hermetically sealed, for example, using an electro-plated feed-through metallization process as the base for the through-hole connections. The feed-through metallization also may include a diffusion barrier, and the sealing material may include, but not limited to, a non-noble metal. Further details of such feed-through metallization techniques are disclosed in related U.S. Pat. No. 6,818,464, the disclosure of which is incorporated herein by reference in its entirety.

Figure 2:
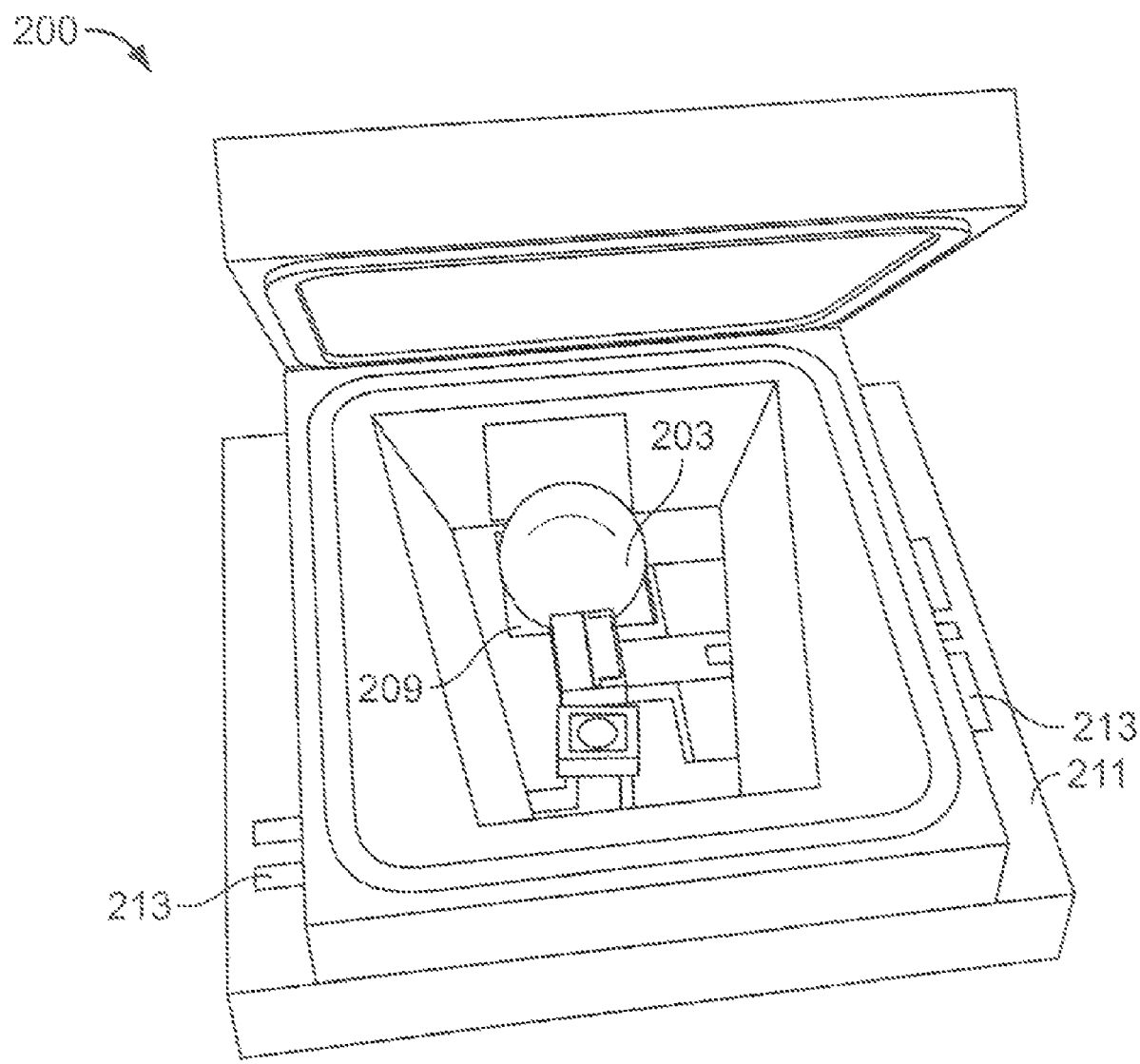
FIG. 2 illustrates assembly of an optical module encapsulated by a micro housing according to a second implementation.

Alternatively, as illustrated in FIG. 2, the electrical lines 213 of optical module 200 may be formed on the surface of the lower portion of the silicon base 211, and extended underneath and through the upper portion of silicon base 211. In this implementation, structuring patterns for the electrical lines 213 is simple because the surface of the silicon base 211 is substantially flat, with the exception of the groove 209 for holding the ball lens 203.

Hermetic sealing may be accomplished using glass frit in between the upper and lower portions of the silicon base 211. For example, glass frit structures may be deposited in the form of rings onto the back side of upper portion of the silicon base 211 or the front side of lower portion of the silicon base 211. In one aspect, the hermetic process may involve printing the glass frit as a paste so that when the upper and lower portions of the silicon base are pressed against one another and heated at a predetermined temperature, the glass frit hermetically seals off any gap embedded between the metal lines. Access to the end of the electrical lines can either be made by removing the section of the upper portion of the silicon base 211 over the end of the electrical lines 213 using a dicing process, or etching additional holes on the upper portion of the silicon base 211 where the end of the electrical lines are to be contacted.

Referring back to FIG. 1A, after the opto-electronic component 101, the lens 103, the 45° mirror 105 and any other electro-optical components are mounted onto the silicon base 111, as discussed above, the optical module 100 is sealed hermetically by arranging the lid 115 on the upper surface of the silicon base 111. Although not shown, it will be readily appreciated that the lid 115 may contain feed-through metallization providing a current path from the upper surface of the lid, via a through-hole and down to the bottom of the lid 115. The feed-through metallization functions to connect electrically various electro-optical components mounted on the base 111 by the vias 113 soldered onto the surface of the base 111.

Figure 4:
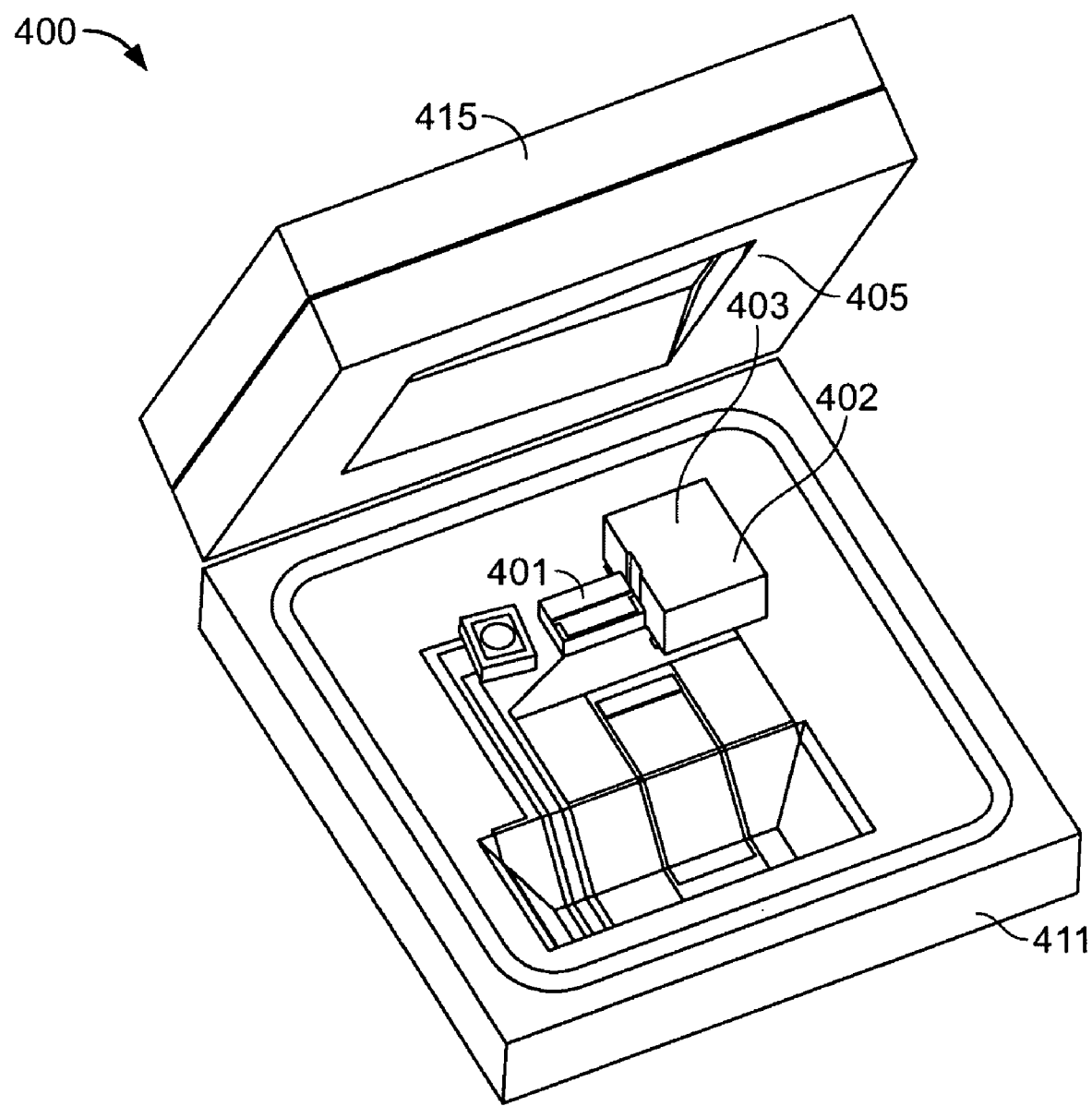
FIG. 4 illustrates assembly of an optical module encapsulated by a micro housing according to a fourth implementation.

In the implementation of FIG. 4, the opto-electronic component 401 may be soldered to the base prior to positioning the lens. If a silicon plano-convex lens is employed, as shown in FIG. 4, a recess 402 with a depth in the center of one side can be implemented, and the assembly order may be advantageously reversed; namely, the lens 403 is bonded prior to mounting the opto-electronic component 401 on the base 411. By incorporating the recess into this implementation, the laser can be moved closer to the lens. The recess 402 also may function to prevent the facet of the opto-electronic component 401 from making contact with the lens, which could potentially damage both optical components.

Figure 3:
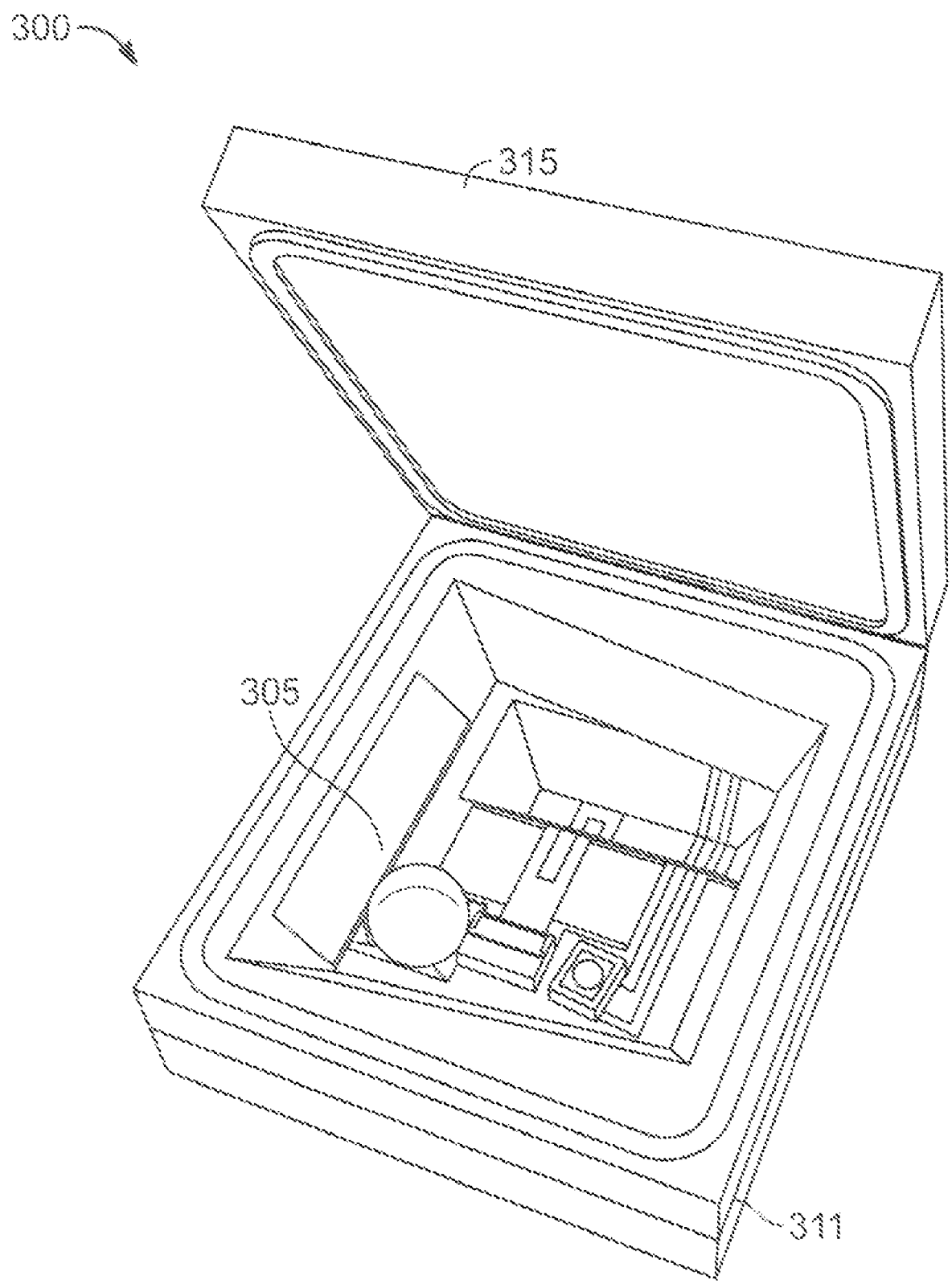
FIG. 3 illustrates assembly of an optical module encapsulated by a micro housing according to a third implementation.

The lid 115 shown in FIG. 1A includes a cavity for accommodating the electro-optical components mounted on the base 111. In a different aspect, as illustrated in FIG. 3, if the 45° mirror 305 is integrated as part of the interior of the base 311, the electro-optical components may be mounted on the base 311 by attaching the wafer having a cavity containing the 45° mirror onto the base 311, and subsequently sealing the optical module 300 with the lid 315. Alternatively, as shown in FIG. 4, the 45° mirror 405 may be integrated as part of the lid 415 mounted on the top surface of the base 411, and the optical module 400 then is hermetically sealed. While the lid(s) illustrated in FIGS. 1-4 may be mounted during any processing, manufacturing or fabrication step, it may be advantageous to solder the lid onto the base as a last step for completing the micro housing containing the optical module, after which various electro-optical components are properly aligned and positioned.

Figure 5:
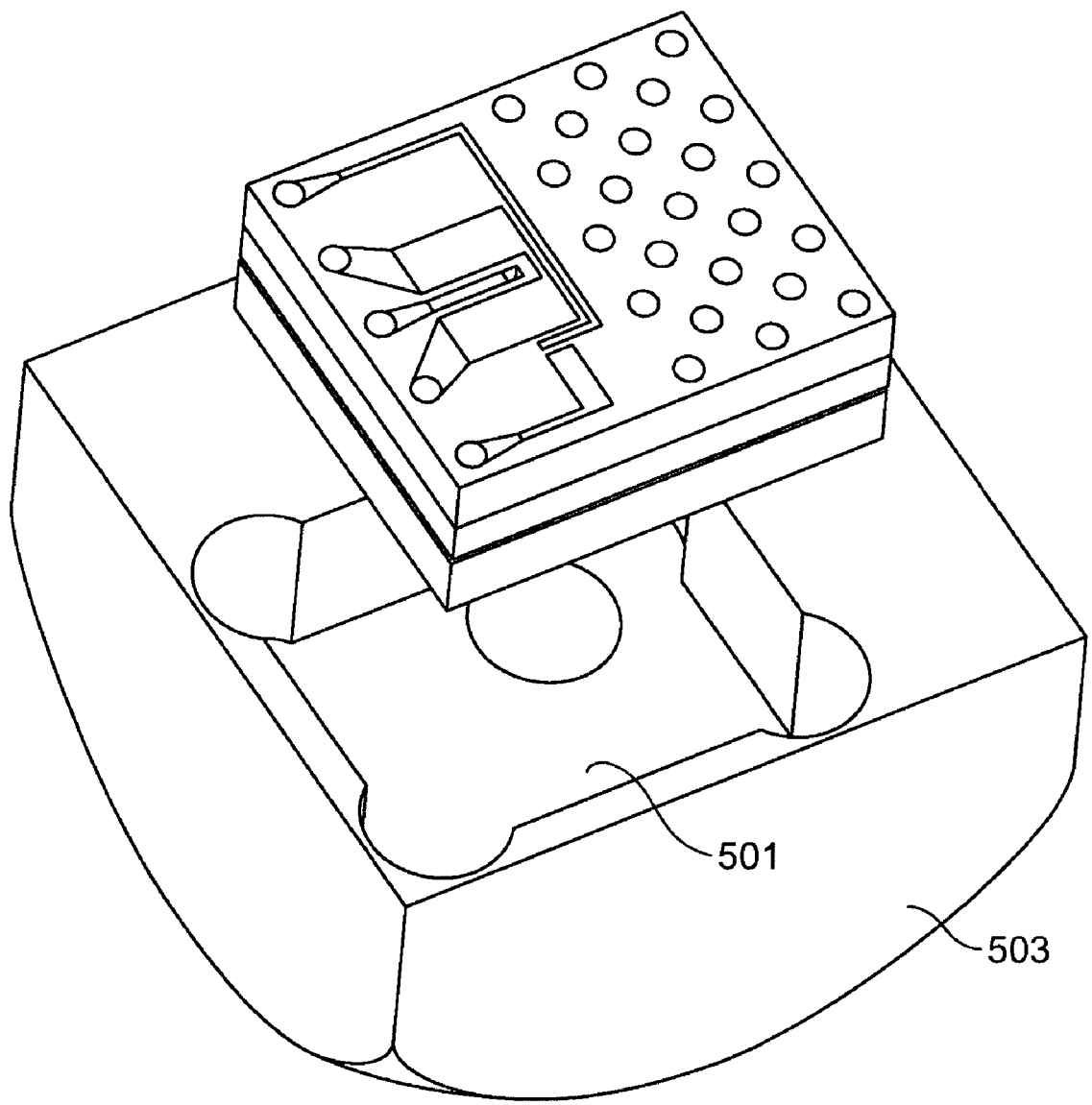
FIG. 5 illustrates a top and side plan view of the micro housing of FIG. 1 mounted on a spherical holder.
Figure 6A:
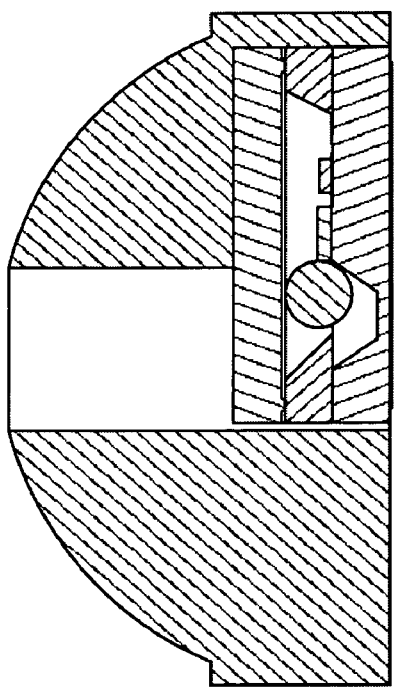
FIGS. 6A-6C illustrate the top and cross-sectional side plan views of an optical module mounted on a spherical holder.
Figure 6B:
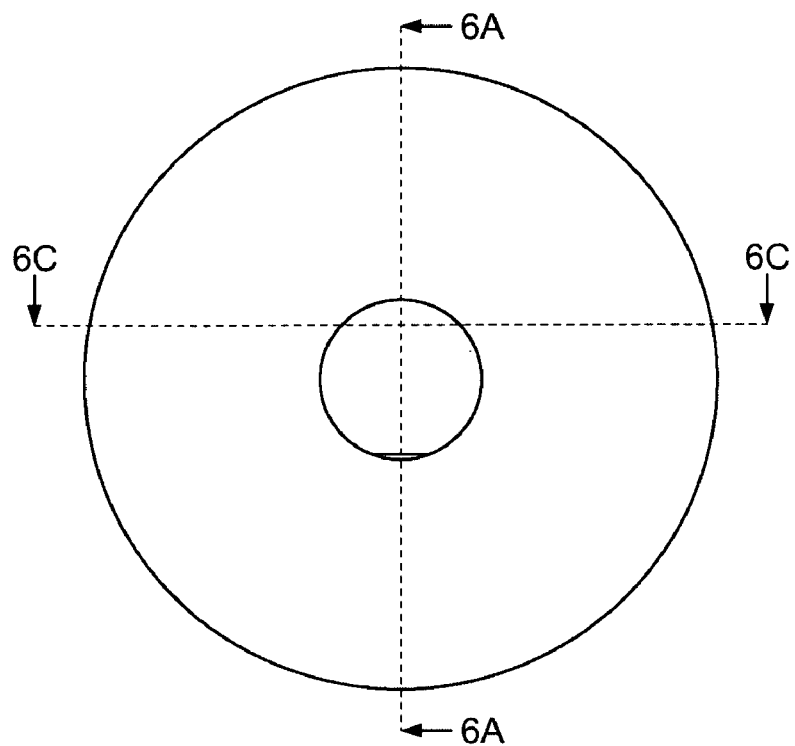
Figure 6C:
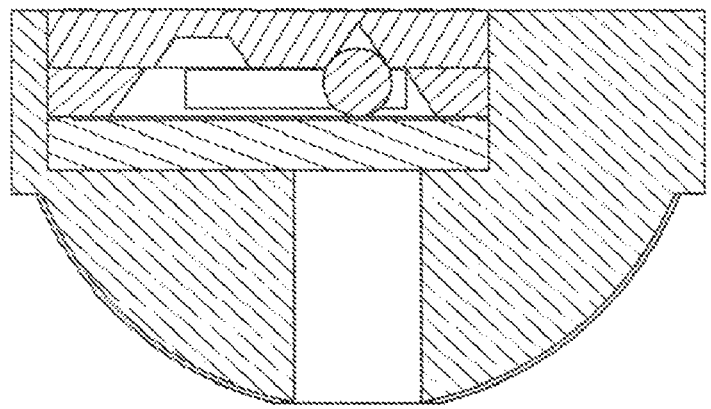

In some implementations, as illustrated in FIG. 5, the optical module described in FIGS. 1 through 4 may be assembled onto a spherical holder 503 having a cut-out region 501 for securing the micro housing containing the optical module so as to facilitate proper alignment. Adhesive or other attaching means may be used for fastening the micro housing onto the spherical holder 503. It is desirable that the center point of the spherical holder 503 and the point around which the micro housing is to be rotated for compensating optical misalignment coincide within a margin of error, for example, about 20 microns. FIGS. 6A-6C illustrate the top and cross-sectional side views of the spherical holder 503 and the micro housing containing the optical module.

Figure 7A:
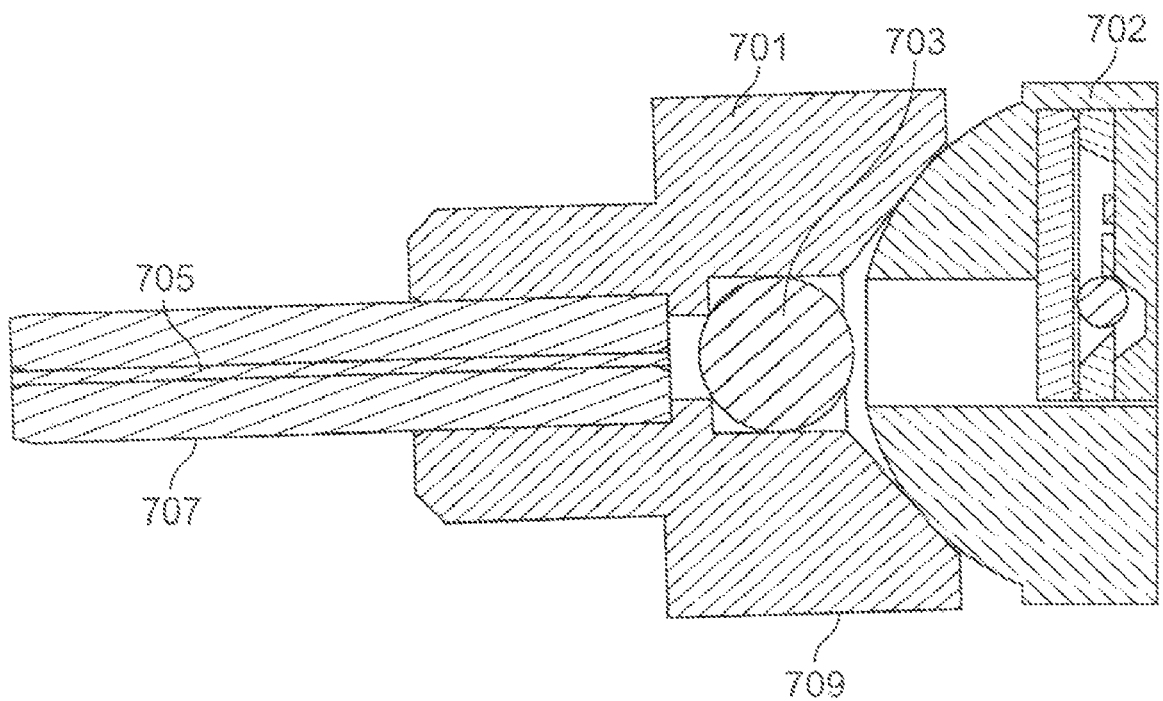
FIGS. 7A-7C illustrate cross-sectional side views of a spherical holder mounted on an assembly including a lens disposed in the beam path.
Figure 7B:
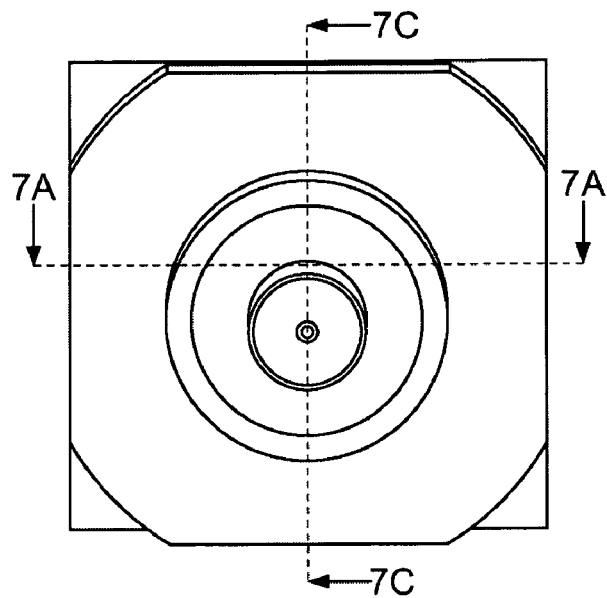
Figure 7C:
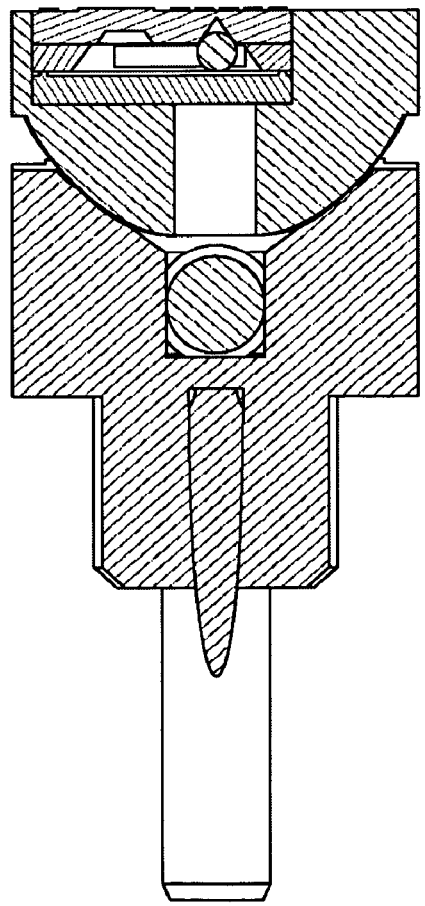

In the final mounting step, as shown in FIGS. 7A-7C, the spherical holder 702 may be mechanically inserted into an assembly 701 containing an optical fiber 705. The assembly 701 includes a housing 709 and a connector-receptacle for the optical fiber 705 which is positioned within the housing 709 by a ferrule sleeve 707. As described above, a lens 703, which includes, but is not limited to, a ball lens or graded index lens, may be placed in the housing 709 between the optical fiber 705 and the holder containing the optical module for focusing the received optical beam into the optical fiber 705.

Due to the passive alignment of the collimating optics and the positioning tolerance associated with the optical module, the collimated beam exiting the optical module may be tilted with respect to the receptacle axis. To reduce the complexity, time consumption and cost associated with active fiber alignment technique, the spherical holder 702 is assembled onto the housing 709 so that any beam misalignment incurred due to geometrical tolerances can be compensated for by rotating the spherical holder 702 For instance, assuming a laser axis-to-lens axis transversal displacement of 5 μm, misalignment can be compensated by rotating the housing with respect to the spherical holder at an angle of 2°.

Operating with a collimated laser beam inside the optical module, has the advantage that other optical components, such as wavelength lockers, optical isolators or phase modulators, may be incorporated into the beam path inside the module, which may not be possible using the conventional TO packaging technology. The optical module of the present invention is well-adapted to surface mounting technology and may also be equipped with a metal heat sink to improve heat associated operation.

Figure 8:
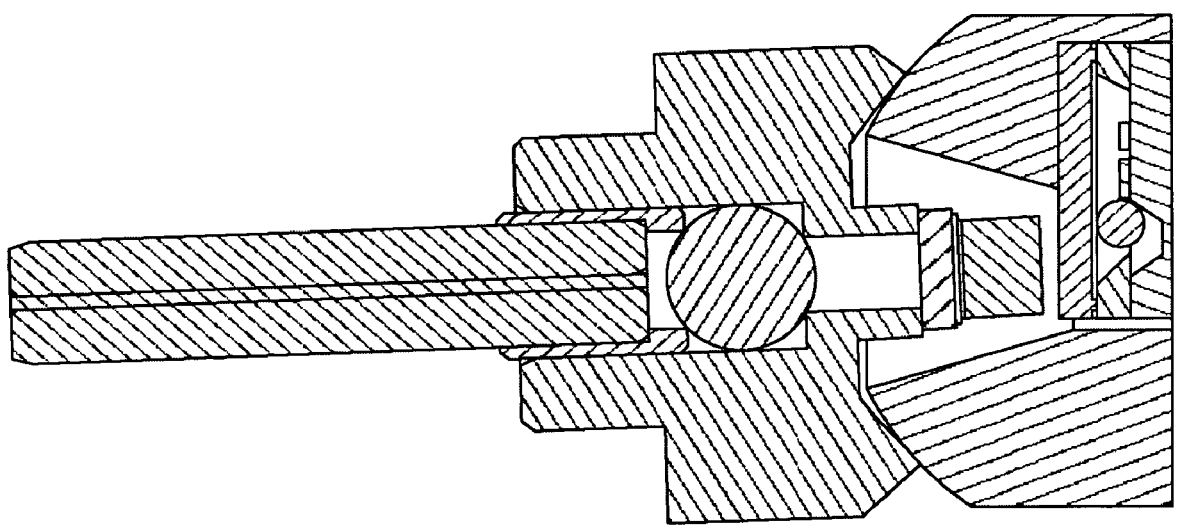
FIG. 8 illustrate cross-sectional side views of a spherical holder mounted on an assembly including a lens and an additional optical component disposed in the beam path.

Although in the foregoing implementations, only an opto-electronic component, a lens and a mirror are inserted into the beam path for fiber coupling of the output of the opto-electronic component, it will be appreciated that other intermediate electro-optical components, which can be packaged together or separately from the optical module, also may be included. For instance, as shown in FIG. 8, an optical isolator, a wavelength filter serving as a wavelength locker, a narrow wavelength filter mounted at a tilted angle towards the optical beam or a partial mirror for reflecting the optical beam back into the opto-electronic component, may be disposed at a position marked "x," as long as the overall structure is consistent with the desired application and design.

In general, those skilled in the art will recognize that the invention is not limited by the details described. Instead, the invention can include modifications and alterations within the spirit and scope of the appended claims. The description is thus to be regarded as illustrative instead of restrictive of the invention. Other implementations are within the scope of the claims.

What is claimed is:

1. A method for aligning a beam emitted from an opto-electronic component, wherein the opto-electronic component, a lens and a reflective surface are integrated on a surface of a micro-housing and wherein the lens and reflective surface are aligned in a direction of an optical axis of the beam emitted from the opto-electronic component, the method comprising:
   rotating the opto-electronic component, lens and reflective surface such that a phase front of a beam exiting the lens rotates about a central point; and
   refocusing the beam into an optical waveguide using an optical assembly that is rotated about the central point, wherein refocusing the beam includes reflecting the beam at an angle of about 90 degrees.

2. The method of claim 1 wherein the opto-electronic component includes an edge emitting laser.

3. The method of claim 1 further comprising reflecting the beam from the lens at a predetermined angle to provide a rotation about the central point.

4. The method of claim 1 wherein the lens includes a collimating lens.

5. The method of claim 1 wherein the optical waveguide includes an optical fiber.

6. The method of claim 1 wherein the optical waveguide includes a collimating lens.

7. The method of claim 1 wherein the opto-electronic component, the lens and the reflective surface for refocusing the beam are integrated in the micro housing.

8. The method of claim 7 wherein refocusing the beam includes rotating the micro housing with respect to the optical assembly including the optical waveguide.

9. A method for coupling an optical beam, the method comprising:
   passively aligning a lens disposed in front of an opto-electronic component emitting an optical beam at a center axis of the optical beam;

reflecting the optical beam at a predetermined angle into an optical waveguide after collimating the optical beam; and rotating a micro-housing comprising the lens, opto-electronic component and a reflector, wherein the lens, opto-electronic component and reflector are integrated on a surface of the micro-housing and are aligned along a direction of the center axis of the optical beam emitted from the opto-electronic component.

10. The method of claim 9 wherein the lens includes one of a collimating lens, a plano-convex lens and a cylindrical gradient index (GRIN) lens.

11. The method of claim 9 wherein the opto-electronic component includes an edge emitter laser.

12. The method of claim 9 further comprising minimizing a distortion of a phase front of the optical beam.

13. The method of claim 9 further comprising rotating the optical waveguide using a rotatable optical assembly that rotates around the center axis.

14. The method of claim 9 wherein the predetermined angle is about 90 degrees.

15. An optical assembly, comprising:

an opto-electronic component to emit a light beam;

a lens disposed at an output of the opto-electronic component to receive and collimate the light beam; and a mirror to redirect the collimated light beam to an optical waveguide, wherein a phase front of the collimated light beam exiting the lens is rotated about a central point, wherein the opto-electronic component, lens and mirror are aligned in a direction of an optical axis of the beam emitted from the opto-electronic component, wherein the opto-electronic component, lens and mirror are integrated on a surface of a micro-housing, and wherein the opto-electronic component, the first lens and the mirror are hermetically integrated into the micro housing including a lid and a base.

16. The optical assembly of claim 15 adapted such that, during operation, the collimated light beam is refocused into the optical waveguide mounted on a rotatable optical assembly that rotates around the central point.

17. The optical assembly of claim 16 wherein the optical assembly is mounted on a rotatable holder.

18. The optical assembly of claim 17 wherein optical alignment between the optical assembly and the optical waveguide is adjustable based on a rotation of the moveable holder.

19. The optical assembly of claim 15 wherein the opto-electronic component, the lens and the mirror are disposed inside a cavity of the base.

20. The optical assembly of claim 19 wherein the lid is attached to the base to seal the optoelectronic component hermetically within an enclosed area.

21. The optical assembly of claim 19 wherein the mirror is integrated as part of the base.

22. The optical assembly of claim 15 wherein the micro housing comprises silicon.

23. The optical assembly of claim 15 wherein the mirror includes a metallized groove having a 45-degree sidewall integrated as part of the base.

24. The optical assembly of claim 15 wherein the mirror is tilted at about a 45-degree angle.

25. The optical assembly of claim 15 wherein the lens includes a ball lens, plano-convex lens or cylindrical gradient index (GRIN) lens.

26. The optical assembly of claim 15 further comprising a recess disposed between the opto-electronic component and the lens.

27. The optical assembly of claim 15 wherein the lid is attached to the base to seal the optoelectronic component, the lens and the mirror hermetically within an enclosed area.

28. The optical assembly of claim 27 wherein the mirror is integrated as part of the lid.

29. The optical assembly of claim 28 wherein the lid is transparent.

* * * * *